United States Patent
Downs et al.

(10) Patent No.: US 8,802,189 B1
(45) Date of Patent: *Aug. 12, 2014

(54) SYSTEM AND METHOD FOR THE TRANSFER OF COLOR AND OTHER PHYSICAL PROPERTIES TO LAMINATE COMPOSITE MATERIALS AND OTHER ARTICLES

(71) Applicant: Cubic Tech Corporation, Mesa, AZ (US)

(72) Inventors: Roland Joseph Downs, Mesa, AZ (US); Christopher Michael Adams, Tempe, AZ (US); Jon Michael Holweger, Queen Creek, AZ (US)

(73) Assignee: Cubic Tech Corporation, Mesa, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/727,919

(22) Filed: Dec. 27, 2012

Related U.S. Application Data

(63) Continuation-in-part of application No. 13/197,741, filed on Aug. 3, 2011, now Pat. No. 8,343,574.

(60) Provisional application No. 61/370,448, filed on Aug. 3, 2010.

(51) Int. Cl.
*B41M 3/12* (2006.01)
*B41M 5/025* (2006.01)

(52) U.S. Cl.
USPC ......... 427/146; 427/147; 427/148; 428/195.1

(58) Field of Classification Search
USPC .................. 427/146, 147, 148; 428/195.1
See application file for complete search history.

(56) References Cited

U.S. PATENT DOCUMENTS

| | | |
|---|---|---|
| 3,644,165 A | 2/1972 | Chen |
| 4,565,714 A | 1/1986 | Koshar |
| 4,588,538 A | 5/1986 | Chung et al. |
| 4,679,519 A | 7/1987 | Linville |
| 4,708,080 A | 11/1987 | Conrad |
| 4,757,742 A | 7/1988 | Mazelsky |
| 4,762,751 A | 8/1988 | Girgis et al. |
| 5,001,003 A | 3/1991 | Mahr |
| 5,094,883 A | 3/1992 | Muzzy et al. |

(Continued)

FOREIGN PATENT DOCUMENTS

| | | |
|---|---|---|
| CN | 101723067 A | 6/2010 |
| DE | 4010086 A1 | 11/1990 |

(Continued)

OTHER PUBLICATIONS

USPTO; Office Action dated Sep. 10, 2013 in U.S. Appl. No. 13/168,912.

(Continued)

*Primary Examiner* — Eisa Elhilo
(74) *Attorney, Agent, or Firm* — Snell & Wilmer L.L.P.

(57) ABSTRACT

A method of transferring a dye to a composite material comprising applying the dye to a transfer media to create a colored transfer media, placing the colored transfer media into contact with the composite material, and applying, using an autoclave, at least one of heat, external pressure, vacuum pressure to infuse the dye to the composite material to create a colored composite material.

18 Claims, 7 Drawing Sheets

(56) References Cited

U.S. PATENT DOCUMENTS

| | | | |
|---|---|---|---|
| 5,333,568 | A | 8/1994 | Meldner et al. |
| 5,470,632 | A | 11/1995 | Meldner et al. |
| 5,591,933 | A | 1/1997 | Li et al. |
| 5,922,161 | A | 7/1999 | Wu et al. |
| 6,071,834 | A | 6/2000 | Martz |
| 6,224,951 | B1 | 5/2001 | Centanni et al. |
| 7,985,463 | B2 | 7/2011 | Stowell et al. |
| 8,080,487 | B2 | 12/2011 | Gardner et al. |
| 8,256,019 | B2 | 9/2012 | Ardiff et al. |
| 8,343,574 | B2 * | 1/2013 | Downs et al. .............. 427/146 |
| 2004/0084138 | A1 | 5/2004 | Henke et al. |
| 2004/0102125 | A1 | 5/2004 | Morman et al. |
| 2005/0112968 | A1 | 5/2005 | Panse |
| 2006/0191427 | A1 | 8/2006 | Geddes et al. |
| 2008/0081171 | A1 | 4/2008 | DuPont |
| 2008/0116043 | A1 | 5/2008 | Chahal et al. |
| 2008/0230173 | A1 | 9/2008 | Cho et al. |
| 2009/0169835 | A1 * | 7/2009 | Stowell et al. ............ 428/195.1 |
| 2010/0168704 | A1 | 7/2010 | Thomas et al. |
| 2010/0304072 | A1 | 12/2010 | Alvelind |
| 2011/0312238 | A1 | 12/2011 | Bader et al. |
| 2012/0100334 | A1 | 4/2012 | Adams et al. |
| 2012/0276380 | A1 | 11/2012 | Traser et al. |

FOREIGN PATENT DOCUMENTS

| | | | |
|---|---|---|---|
| DE | 202011004434 | U1 | 6/2011 |
| EP | 0361796 | A2 | 4/1990 |
| EP | 0579047 | A1 | 1/1994 |
| EP | 0699877 | A2 | 3/1996 |
| GB | 2051674 | A | 1/1981 |
| WO | 8809630 | A1 | 12/1988 |
| WO | 9411185 | A1 | 5/1994 |
| WO | 0002427 | A1 | 1/2000 |
| WO | 0128196 | A1 | 4/2001 |
| WO | 03005684 | A1 | 1/2003 |
| WO | 2012017233 | A1 | 2/2012 |

OTHER PUBLICATIONS

USPTO; Notice of Allowance dated Mar. 21, 2014 in U.S. Appl. No. 13/168,912.
USPTO; Office Action dated Mar. 21, 2012 in U.S. Appl. No. 13/197,741.
USPTO; Notice of Allowance dated Oct. 4, 2012 in U.S. Appl. No. 13/197,741.
PCT; International Search Report dated Feb. 10, 1994 in Application No. PCT/US1993/011425.
PCT; International Search Report dated Oct. 31, 2011 in Application No. PCT/US2011/041914.
PCT; Written Opinion of the International Search Authority dated Oct. 31, 2011 in Application No. PCT/US2011/041914.
PCT; International Preliminary Report on Patentability dated May 17, 2012 in Application No. PCT/US2011/041914.
PCT; International Search Report dated Dec. 16, 2011 in Application No. PCT/US2011/046497.
PCT; Written Opinion of the Intenational Searching Authority dated Dec. 16, 2011 in Application No. PCT/US2011/046497.
PCT; International Preliminary Report on Patentability dated Aug. 2, 2012 in Application No. PCT/US2011/046497.
PCT; International Search Report and Written Opinion dated Feb. 21, 2014 in Application No. PCT/US2013/061509.
PCT; International Search Report and Written Opinion dated Feb. 28, 2014 in Application No. PCT/US2013/060487.
EPO; Supplementary European Search Report dated Jul. 27, 1995 in Application No. EP 94902379.
EPO; Office Action dated Apr. 4, 1997 in Application No. EP 94902379.
EPO; Office Action dated Jul. 22, 1998 in Application No. EP 94902379.
EPO; Office Action dated Jun. 17, 1999 in Application No. EP 94902379.
EPO; Office Action dated Aug. 17, 2000 in Application No. EP 94902379.

* cited by examiner

SYSTEM AND METHOD FOR THE TRANSFER OF COLOR AND OTHER PHYSICAL PROPERTIES TO LAMINATE COMPOSITE MATERIALS AND OTHER ARTICLES

CROSS-REFERENCE TO RELATED APPLICATION

The present application is a continuation-in-part and is related to and claims priority from application Ser. No. 13/197,741, filed Aug. 3, 2011, entitled "SYSTEM AND METHOD FOR THE TRANSFER OF COLOR AND OTHER PHYSICAL PROPERTIES TO LAMINATE COMPOSITE MATERIALS AND OTHER ARTICLES", and which application is related to and claims priority from prior provisional application Ser. No. 61/370,448, filed Aug. 3, 2010, entitled "SYSTEM AND METHOD FOR COLOR TRANSFER TO LAMINATE COMPOSITE MATERIALS AND OTHER ARTICLES", the contents of both of which are incorporated herein by this reference and are not admitted to be prior art with respect to the present invention by the mention in this cross-reference section.

BACKGROUND

This invention relates to providing a system and method relating to coloring laminate reinforced materials.

In a typical prior art embodiment, laminated reinforced materials are plain in color and not conducive to being dyed or colored. One known technique for adding color to laminated material is to paint the material. However, painting the material has the downside of the paint flaking off through use and fading in sunlight over time. These drawbacks can be very pronounced in flexible laminate material. In another prior art embodiment, laminated reinforced materials are combined with additional layers of films or other materials to produce a fiber reinforced flexible fabric. The other additional materials may include a more traditional woven cloth that is capable of being dyed. Materials of this type are generally found in applications requiring high performance and visual or cosmetic appearance is secondary. The typical accepted appearance is plain, as manufactured, and/or lacking visual coloration, patterns, or graphics.

However, it may be desirable in various applications for the consumer to have more visually appealing material. Thus, it is desirable to produce laminated reinforced materials that are colorable, able to be patterned, or other physical properties, along with the material being resistant to fading.

OBJECTS AND FEATURES OF THE INVENTION

A primary object and feature of the present invention is to provide a system overcoming the above-mentioned problem(s).

A further primary object and feature of the present invention is to provide such a system that is efficient, inexpensive, and handy. Other objects and features of this invention will become apparent with reference to the following descriptions.

SUMMARY OF THE INVENTION

In accordance with a preferred embodiment hereof, this invention provides a method of transferring a dye to a composite material, the method comprising: applying the dye to a transfer media to create a colored transfer media; placing the colored transfer media into contact with the composite material; and applying, using an autoclave, at least one of heat, external pressure, vacuum pressure to infuse the dye to the composite material to create a colored composite material. Moreover, it provides such a method of claim 1, further comprising cooling the composite material to a temperature such that the composite material maintains a desired shape. Additionally, it provides such a method of claim 1, further comprising curing the dye, by applying at least one ultraviolet or electron beam radiation, to the composite material. Also, it provides such a method of claim 1, further comprising adding a polyimide coating to the composite material. In addition, it provides such a method of claim 1, further comprising adding a polyvinyl fluoride (PVF) film to the composite material. And, it provides such a method of claim 1, further comprising adding a nylon coating and a urethane coating to the composite material. Further, it provides such a method of claim 1, wherein composite material is a non-woven material. Even further, it provides such a method of claim 1, wherein composite material is a woven material. Moreover, it provides such a method of claim 1, wherein composite material comprises at least one layer of woven materials and at least one layer of non-woven materials. Additionally, it provides such a method of claim 1, wherein the transfer media is at least one of transfer paper, transfer laminate, or transfer film. Also, it provides such a method of claim 1, wherein the dye may be applied to the transfer media in the shape of a pattern, graphic or logo, and wherein the colored composite material is infused with a matching pattern, graphic or logo, respectively. In addition, it provides such a method of claim 1, wherein the dye is applied to the transfer media using direct printing. And, it provides such a method of claim 1, wherein the transfer media is at least one of transfer paper, transfer laminate, or transfer film. Further, it provides such a method of claim 1, wherein the dye may be applied to the transfer media in the shape of a pattern, graphic or logo, and wherein the colored composite material is infused with a matching pattern, graphic or logo, respectively. Even further, it provides such a method of claim 1, wherein the dye is applied to the transfer media using direct printing.

Figure 1:
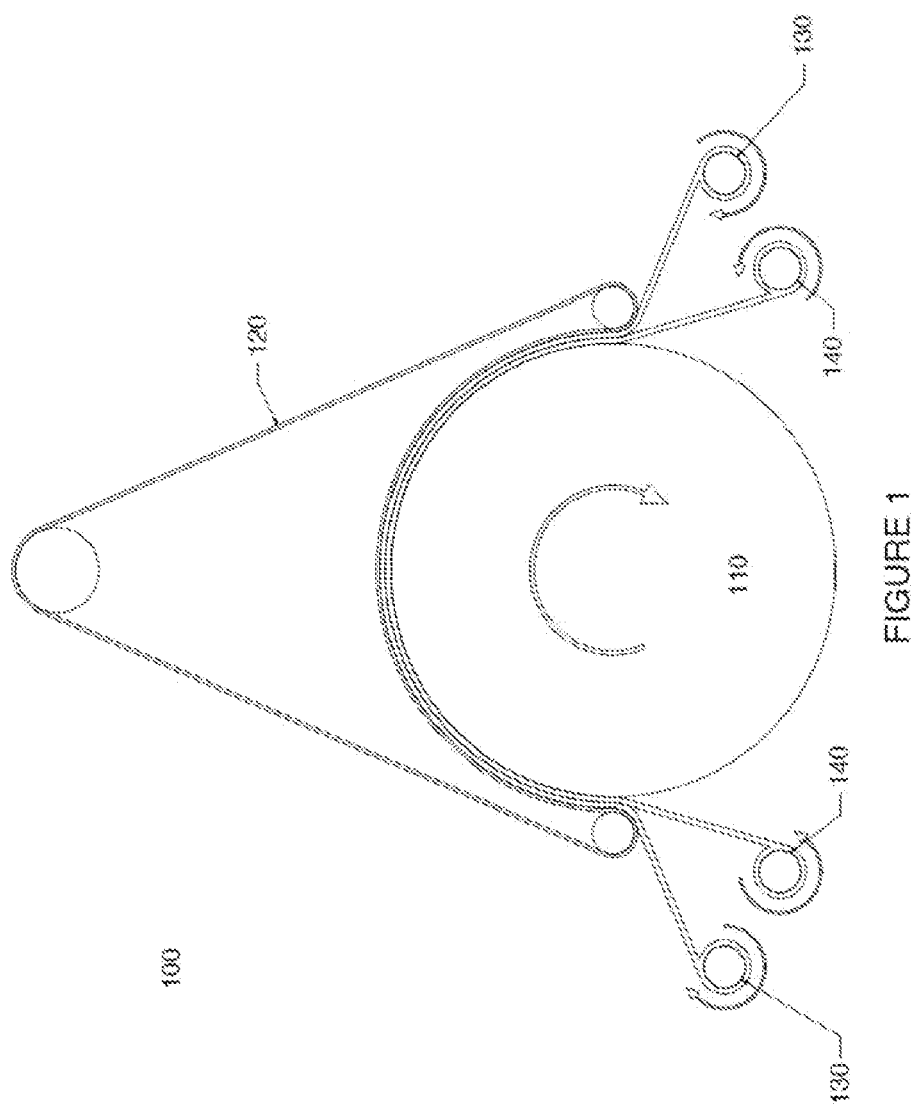
FIG. 1 illustrates an exemplary embodiment of a rotary color transfer system.

DETAILED DESCRIPTION OF THE BEST MODES AND PREFERRED EMBODIMENTS OF THE INVENTION

While exemplary embodiments are described herein in sufficient detail to enable those skilled in the art to practice the invention, it should be understood that other embodiments may be realized and that logical material, electrical, and mechanical changes may be made without departing from the spirit and scope of the invention. Thus, the following detailed description is presented for purposes of illustration only.

Materials Various types of composite materials include both woven materials and non-woven materials. In an exemplary embodiment, woven materials use many low denier tows (light weight fibers). The woven material comprises fibers passing over and under each other in a weave pattern, which results in the fibers "crimping". Also, in woven materials, tensile loading induces transverse loads at fiber overlap sections as crimped fibers attempt to straighten. The transverse loads reduce the translation of fiber strength to fabric strength and decrease long-term fatigue and creep rupture performance. In an exemplary embodiment, higher performance engineering fibers have more pronounced crimp-related reduction properties. This is particularly pronounced in fibers with optimization of axial filament properties and reduced transverse properties of the filaments.

As used herein, a Composite Material is defined as one or more layers of unidirectional fiber and polymer matrix plies oriented in one or more directions. In contrast, in an exemplary embodiment, non-woven Composite Materials use high denier tows for easier manufacturability. The non-woven Composite Materials comprise fibers that do not pass over and under each other and thus do not have crimp. An advantage of non-woven Composite Materials is unlimited fiber areal weights, which is the weight of fiber per unit area. In other words, thicker fibers can be used than in woven materials. Another advantage is the ability to form Composite Materials using multiple layers oriented at any angle relative to other layers. Furthermore, in an exemplary embodiment, a non-woven Composite Materials is designed with optimal weight, thickness, and strength at particular locations or along predetermined load paths as desired. In addition, non-woven Composite Materials constructed from high modulus fibers may have predictable and linear properties for engineering designs.

In accordance with an exemplary embodiment, a Composite Materials is infused with color during the manufacturing process. In various embodiments, the Composite Materials is made from one or more layers of thinly spread high strength fibers such as, for example, Dyneema®, Vectran®, Aramid, polyester, carbon fiber, Zylon PBO, or other materials that are coated with adhesive or other material, or any combination thereof. The color could be a solid color, a pattern, or any type of graphic such as a picture or logo on one or both sides of the composite material. The range of infused color is not limited, allowing a broad range of colored material possibilities. For example, such color possibilities include titanium dioxide, carbon black, phthalo blue, quinacridone red, organic yellow, phthalo green, dark yellow orcher, ercolano orange, venetian red, burnt umber, viridian green, ultramarine blue and pewter grey. Other possibilities include manufacturing the Composite Materials to have stripes, polka dots, figures, shapes, and the like. In an exemplary embodiment, the laminate films and/or fabrics can also have other tints sublimating or non-sublimating, color bases, modifiers or ultra-violet or color stabilizers pre-incorporated to interact with, synergize, or modify the color process.

In other various embodiments, Composite Materials can also have various coatings added to alter the material's surface properties. The various coatings can be in addition to, or as alternative to, added color dyes to the material. In a first exemplary embodiment, a film coating is added to the material. The specific film coating can be used to increase or decrease the composite's tensile strength, toughness, chemical and dimensional stability, weld-ability, gas barrier properties, electrical properties, high temperature resistance, ultra-violet or infrared radiation performance, and/or reduce the coefficient of friction. In a second exemplary embodiment, a polyimide coating is added to the Composite Material. The polyimide coating can alter the electric and dielectric properties of the material. Furthermore, the polyimide coating may be configured to increase the stability of the material properties over a wide range of temperature. In a third exemplary embodiment, polyvinyl fluoride (PVF) film, such as Tedlar, is added to the Composite Material. The PVF film facilitates added weather durability, long term durability, and environmental stability. Similarly, in a fourth exemplary embodiment, nylon and urethane coatings both increase toughness and are flexible, along with lower mechanical and permeability properties.

In accordance with an exemplary embodiment, a Composite Material is layered with woven coatings to create a Composite Material hybrid. The woven coatings can be incorporated to increase abrasion resistance. Furthermore, in an exemplary embodiment, the Composite Material hybrid may be designed to combine the various material properties of the Composite Material and the coatings to result in a high strength, dimensionally stable flexible Composite Material. Examples of Composite Material hybrid applications include military applications such as advanced visual camouflage and/or infrared signature reduction. Another example is use in a ballistic armor vest.

In an exemplary embodiment, sublimation infusion is implemented to achieve various additions to Composite Materials. The additions may include, for example, color, pattern, and gloss application, specular or infrared reflectivity modification, anti-microbial or medicines, surface adhesion modifiers, nano-material infusion, dielectric modifiers, the printing of conductive metal or polymer materials to add electrical/dielectric conductivity features or electrical circuit patterns, and/or incorporation of fire retardant materials or synergistic components for fire retardant materials in the laminate, surface films, or surface fabrics. In an exemplary embodiment, ultra-violet stabilizing or curing additives are incorporated into the material. These additives can extend the useful life of the Composite Material.

Furthermore, in various embodiments, a fire retardant adhesive or polymer is used with the Composite Materials. Furthermore, fire retardants may be added to a flammable matrix or membrane to improve the flame resistance of the composite material. Fire retardants may function in several ways, such as endothermic degradation, thermal shielding, dilution of gas phase or gas phase radical quenching. Examples of fire retardant additives include: DOW D.E.R. 593 Brominated Resin, Dow Corning 3 Fire Retardant Resin, and polyurethane resin with Antimony Trioxide (such as EMC-85/10A from PDM Neptec Ltd.), although other fire retardant additives may also be suitable as would be known to one skilled in the art. Additional examples of fire retardant additives that may be used to improve flame resistance include Fyrol FR-2, Fyrol HF-4, Fyrol PNX, Fyrol 6 and SaFRon 7700, although other additives may also be suitable as would be known to one skilled in the art. In various embodiments, fire retardancy and self extinguishing features can also be added to the fibers either by using fire retardant fibers, ceramic or metallic wire filaments, inherent fire retardant fibers, or by coating the fibers. Examples of fire retardant fibers include Nomex or Kevlar. Inherent fire retardant fibers include fibers that have had fire retardant compounds added directly to the fiber formulation during the fiber manufacturing process. Furthermore, fibers may be coated with a sizing, polymer or adhesive incorporating fire retardant compounds, such as those described herein or other suitable compounds as would be known to one skilled in the art. In additional various embodiments, any woven or scrim materials used in the Composite Material may be either be pretreated for fire retardancy by the supplier or coated and infused with fire retardant compounds during the manufacturing process. In an exemplary embodiment, ultra-violet stabilizing or curing additives are incorporated into the Composite Material. These additives can extend the useful life of the material.

The Composite Materials are assembled as a multilayer composite of outer surface layers, which may be colorized or textured, via any of the various application methods set forth herein. The outer surface layers may be unidirectional plies, films, non-woven fabric or felt, woven cloth, weldable thermoplastic membranes, waterproof breathable membranes and fabric scrims. These outer surface materials may have initial coloring or patterning complementary to the various methods of infusion transfer, sublimation transfer or roll transfer in order to obtain the desired cosmetic or visual effect. Additionally, in order to adjust the saturation, hue, opacity or light transmission of the finished colorized materials various powder tints, colored dyes or sublimation colorants can also be added to the bonding adhesives or the laminating resin component of the unitape layers. In order to further adjust the saturation, hue, opacity or light transmission of the finished colorized materials one or more tinted, opaque or light blocking film may be added between one or more of the laminate ply interfaces.

There are several applications suitable for the Composite Materials in industrial and technical textiles, apparel, sporting goods, water sports, boating and sailing materials, sail cloth, hunting and fishing, Balloon and Lighter Than Air vehicles, commercial fabric, upholstery, inflatable structure, military apparel, gear, medical or protective articles or devices, tension structures, seismic structural reinforcement materials, banner and signage and other flexible material or fabric applications where the high performance, light weight, high strength, rip and tear resistance, high flexibility, flex life, durability, weatherability and unique characteristics of flexible composite materials are very desirable but cosmetic or visual coloration, patterns, graphics and other visual properties or effects are also a significant component of the intended purpose of the material or product. Properties such as absorption or reflection of various wavelengths of the ultraviolet, visual, infrared or other regions of the electromagnetic spectrum and/or surface texture or shape, gloss or sheen, opaqueness, light transmission or blocking, or colorfastness and fade resistance are also desirable.

Since many of these potential applications are consumer oriented such as the apparel, outdoor, sporting goods, hunting and fishing, water sports, boating and sailing, or medical fabrics or textiles, which have special requirements or features such as fire retardancy or fire resistance, anti-odor, anti-mildew or anti-microbial resistance, water resistance and/or breathability, chemical resistance or abrasion resistance, any combination of the methods and materials are contemplated to fulfill the desirable characteristics for the intended application.

Methods of Application of Color

Various methods may be implemented to facilitate the transfer of dye to a Composite Material. These methods generally are of two types of processes: continuous process and batch process. A continuous process is one where material is unrolled at a steady web speed or at steady stepwise stop-and-start rate. The material is assembled, consolidated, colorized, textured and then rewound onto a rewind roll. In batch process, the Composite Material constituents and colorants are loaded into a press, vacuum bag or autoclave and then subjected to a heating/curing process.

In accordance with exemplary embodiments, the various methods of dye transfer may include heat transferring from a printed or saturated carrier; direct printing onto laminate or surface films via ink jet or dye sublimation printer; incorporation of dye, tint, or sublimating color or pattern directly onto or into the Composite Material or matrix; heat transfer onto a Composite Material or film; and bath or dipping infusion. In an exemplary embodiment, sublimating ink is used for more resistant and permanent coloring.

In accordance with an exemplary method, color is applied to a Composite Material using a transfer carrier substrate. As an initial step, the transfer carrier is selected, such as a film or paper. The color applied may be a solid color or may be a pattern or graphic, which is placed on the transfer carrier. In various exemplary embodiments, application of a solid color to the Composite Material may be facilitated through direct printing or transfer onto an intended surface, layer, or interface of the laminated material. The transfer process may use at least one of an inkjet printer, a gravure roll coater, a slot die coating head, dip bar bath coating, an anilox roll coating, a knife over roll coater, a reverse roll coater, and an air knife coater.

In various exemplary embodiments, application of a pattern or graphic to the Composite Material may be facilitated through use of at least one of an inkjet printer, a sublimation printer, flexo printer process, anilox roll printing, and offset printing. Whether a solid color or a pattern/graphic is transferred, the transfer carrier substrate is in proximity to the Composite Material, such that heat applied through various methods and systems if a separate carrier is used to transfer, infuse or sublimate the color or pattern onto the Composite Material.

The various systems and processes applied to achieve the color transfer to Composite Materials include a heated rotary system, a heated press system, an autoclave system, a dye infusion system, a heated linear color transfer system and matrix pigment tint coloring.

Heated Rotary System

In one exemplary embodiment and with reference to FIG. 1, a rotary color transfer system 100 comprises a rotating heated roll 110, a tensioned belt 120, a roll of material to receive color 130, and a color transfer carrier 140. Rotary color transfer system 100 is a continuous roll-to-roll process for applying color or graphics to materials 130. The material 130 that receives the color may be fabric, cloth, film, or laminated material. The film or fabric can then be used in the manufacture of Composite Materials. For example, rolls of finished Composite Materials, film or fabric precursor may be run through rotary color transfer system 100 to set or infuse the colors. In an exemplary embodiment, material 130 may be pre-coated or pre-printed with color before being fed through the belt press portion of rotary color transfer system 100.

In other embodiments, color transfer carrier 140 may be film or paper. The color transfer carrier 140 can be fed from rolls on an unwind and processed through rotary color transfer system 100 to transfer colors or patterns to material 130, such as film, fabrics, and Composite Materials. Accordingly, tensioned belt 120 is in contact with rotating heated roll 110. Furthermore, material 130 and color transfer carrier 140 are processed in contact with each other and rolled between rotating heating roll 110 and tensioned belt 120. The color can be applied to material 130 via direct printing either in-line or off-line. An in-line process includes applying or coating the colors or patterns to Composite Material, film or fabrics, or color carrier 140 as part of the belt press portion of rotary color transfer system 100. An off-line process includes applying or coating the colors or patterns to laminate, film or fabrics, or color carrier 140 as part of a separate batch process before being set up onto the belt press portion of rotary color transfer system 100. In an exemplary embodiment, heated rotary belt 120 can be used inline with a lamination process. Moreover, the color can be transferred from color transfer carrier 140. In an exemplary embodiment, a vacuum is established between rotating heated roll 110 and tensioned belt 120 to facilitate color infusion and transfer. Various methods may be used to create the vacuum as would be known to one skilled in the art.

In an exemplary embodiment, and as illustrated in FIG. 1, color transfer carrier 140 is closest to rotating heated roll 110 and material 130 is closest to tensioned belt 120. In other exemplary embodiment, material 130 is closest to rotating heated roll 110 and color transfer carrier 140 is closest to tensioned belt 120. In an exemplary embodiment, material 130 and color transfer carrier 140 are both individual rolls that are unwound, processed through the rotary belt process as described above, and then rewound onto individual rolls.

Heated Press System

Figure 2A:
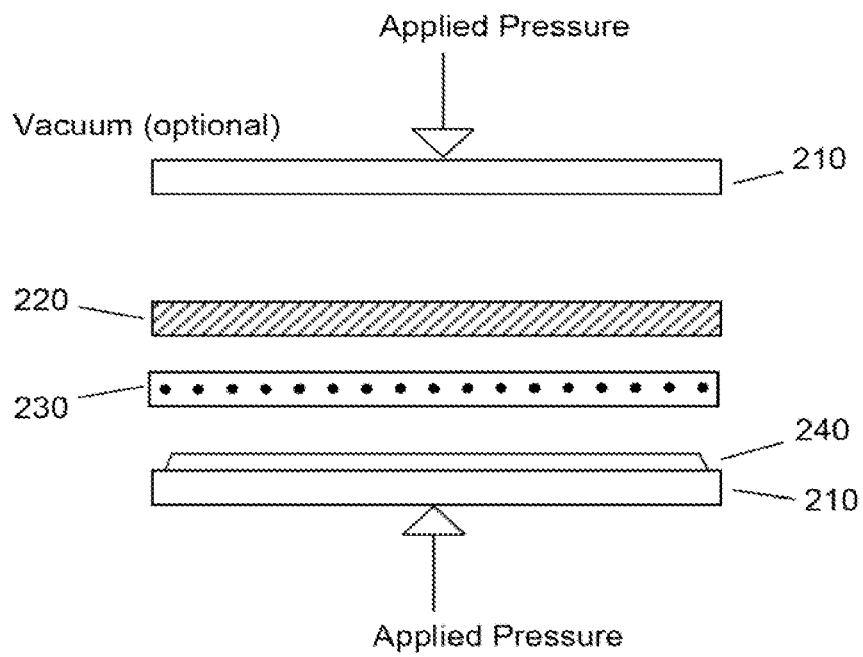
FIGS. 2A and 2B illustrate an exemplary embodiment of a heated press color transfer system and corresponding pressure graph.
Figure 2B:
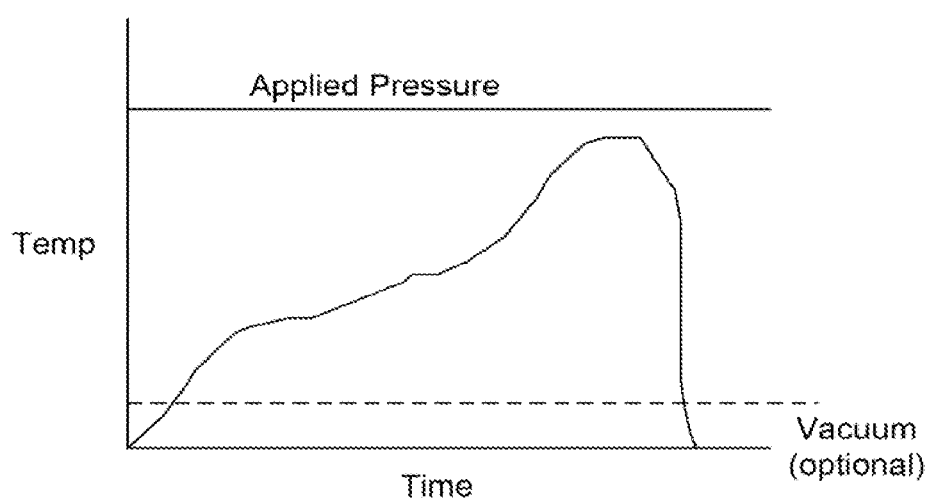

In accordance with an exemplary embodiment and with reference to FIGS. 2A and 2B, a heated press color transfer system 200 comprises two plates 210 or other similar hard surface, a material to receive the color 220, and a color carrier 230. In another embodiment, heated press color transfer system 200 further comprises a pressure intensifier layer 240 made from natural or synthetic rubber. By way of example, suitable caul rubbers are produced by Torr Technologies or Airtech International. The pressure intensifier layer 240 is coupled to the inside at least one of two plates 210 such that pressure intensifier layer 240 in between two plates 210 and in contact with Composite Material 220 and/or color carrier 230. In an exemplary embodiment, pressure intensifier layer 240 has at least some ability to compress. The compression facilitates additional pressure to be applied to two plates 210 and transferred to material 220 and color carrier 230. In various embodiments, pressure intensifier layer 240 may have a combination of one or more smooth mirror surfaces, smooth matte surface, and a textured or pattern surface to provide a desired surface gloss or texture that complements the colorants.

Figure 3:
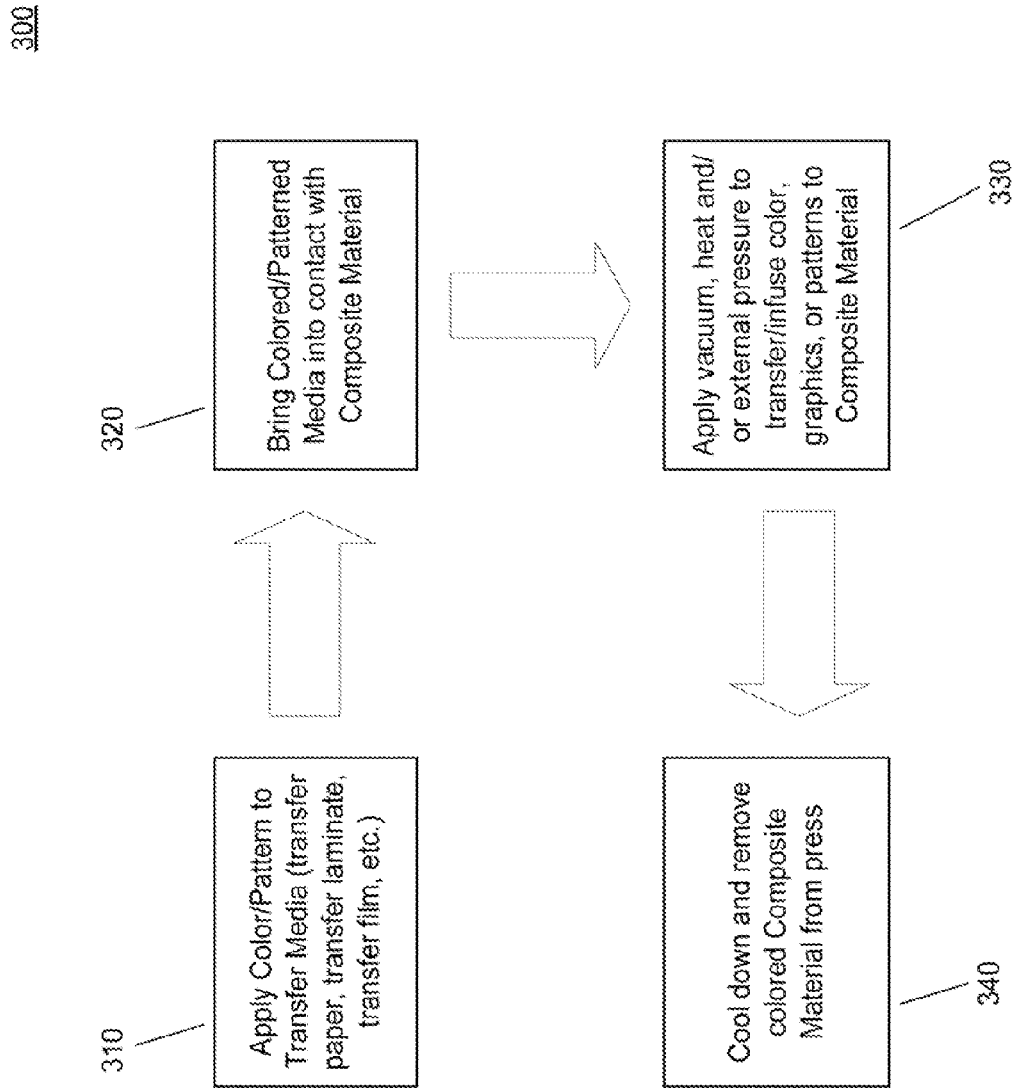
FIG. 3 illustrates a flow chart of an exemplary heat press process.

In an exemplary process and with reference to FIG. 3, a heat press process 300 includes four primary steps. First, apply a color tint/dye transfer to the color carrier, which may include Composite Material with a surface film or cloth surface on one or both sides, or may include transfer paper/film carrier (310). In various embodiments, the film or cloth surface may incorporate a complementary color or pre-printed pattern, image or design on one or both sides of the laminate. Furthermore, transfer paper/film carrier may contain solid color, one or more color patterns or printed graphics to form an image, design, or picture. Additionally, the transfer media may also include a smooth or textured surface to impart a surface with a desired degree of gloss or smoothness texture pattern on one or both sides of the colorized surface. Second, position the color tint/dye transfer in contact with the Composite Material (320). Third, apply heat and pressure to transfer, sublimate, and/or infuse the color, graphics, textures or patterns to the materials (330). Temperatures typically range from about 70° F. to about 650° F., and pressures range from the minimum to keep materials in intimate contact, typically 2 psi, to a maximum of 10,000 psi. The temperature and pressure applied depend on the particular colorant used, the substrates the colorant is applied to, and the degree of lamination or consolidation required. Fourth, cool the material to a temperature such that the finished article remains flat or in the desired shape, and such that there is no damage, distortion, or delamination of the finished colorized material. Once the system is at or below the removal temperature, remove the material and color carrier from the heated press (340).

In yet another exemplary embodiment, the heated press color transfer system further comprises a vacuum to increase the pressure in the process. The exemplary vacuum may be created either by enclosing the press platens within a sealable vacuum chamber or by enclosing the laminate in a vacuum bag system. The applied vacuum can range from about 5 to about 29 inches of mercury (Hg). Once the vacuum has been applied, the assembly is placed into the press such that the press platens apply the appropriate pressure profile during the profile of the heating cycle and cooling cycle. Implementing a vacuum is beneficial to assist in the sublimation colorant into the substrate, to lower the temperature at which sublimation colorant transfer occurs, to remove any trapped air or bubbles from the materials, and to prevent oxidization at higher temperatures. If appropriate, the material may be exposed to ultraviolet or electron beam radiation to cure or set curable tints or dyes.

Autoclave System

Figure 4A:
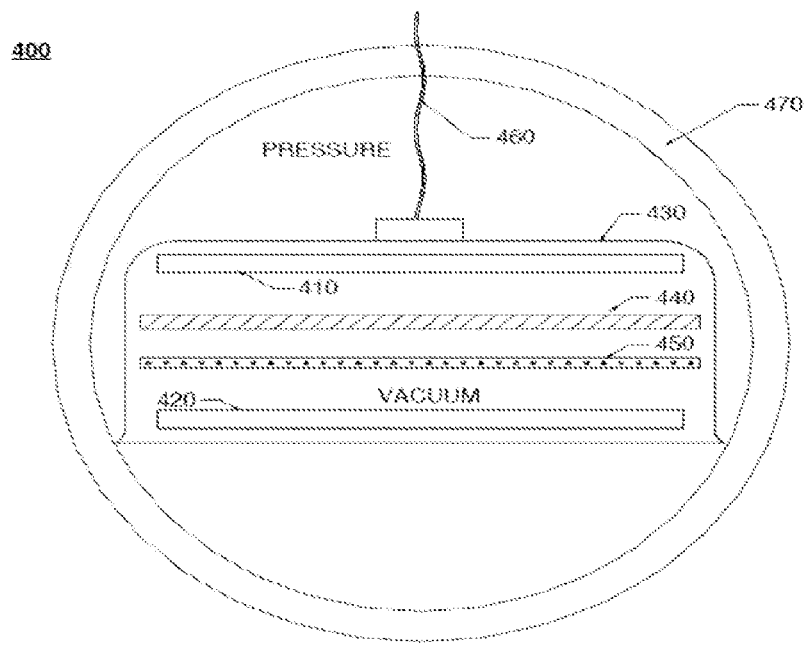
FIGS. 4A and 4B illustrate an exemplary embodiment of an autoclave color transfer system and corresponding pressure graph.
Figure 4B:
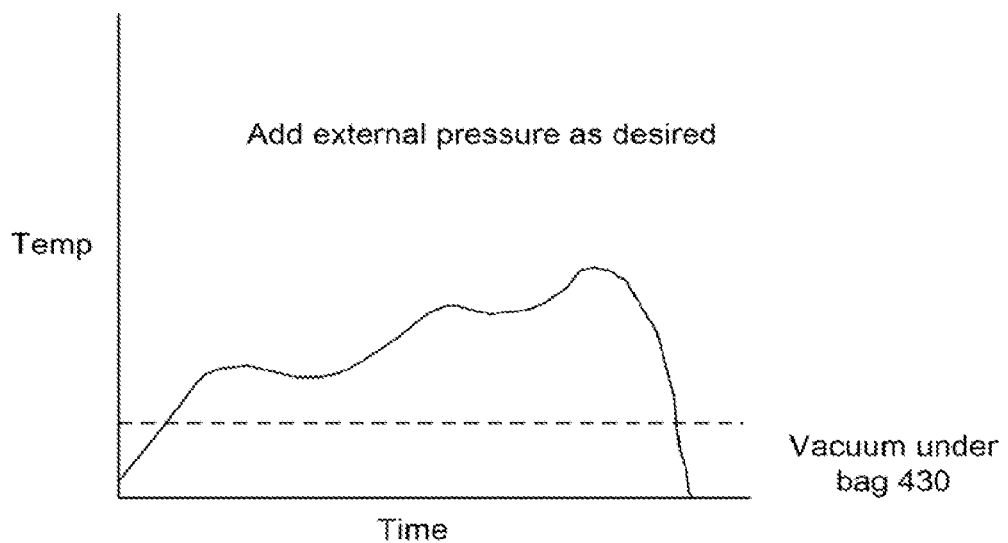

In accordance with an exemplary embodiment and with reference to FIGS. 4A and 4B, an autoclave color transfer system 400 comprises a rigid or reinforced elastomeric tool plate 410 and, optionally, a rigid or elastomeric caul plate 420 inside a vacuum bag 430. In various embodiments, tool plate 410 is typically a stiff plate having a smooth surface while caul plate 420 may be thinner and/or more compliant than tool plate 410. Vacuum bag 430 is made of flexible, impermeable material, or may be a flexible, impermeable elastomeric diaphragm. Alternatively, vacuum bag 430 may be sealed to the side or outer surface of first caul plate 410. Vacuum bag 430 is typically 0.001-0.015 inches thick nylon or other flexible film with suitable temperate and pressure resistance, which is sealed with a tape or strip of tacky high temperature caulk. Suitable bag and sealant materials include Airtech Securelon L500Y nylon vacuum bag and TMI Tacky Tape or Aerotech AT-200Y sealant tape. Moreover, if a diaphragm is used in place of a vacuum bag, the diaphragms are typically low durometer, high temperature resistant silicone rubber, and generally have a thickness of 0.032-0.060 inches.

In place of direct printing or color transferring to material, autoclave system 400 further comprises one or more color transfer carriers 440 and a colorant receiving material or laminate 450. Color transfer carrier 440 is placed in contact with receiving material 450, where both are between tool plate 410 and caul plate 420. For embodiments with high pressure and temperature operations or with large areas, a permeable felt or non-woven breather material may be included on top of the caul to allow air to flow freely under vacuum bag 430 in order to provide uniform compaction pressure. One example of a suitable breather material is Airtech Airweave 10. The air inside vacuum bag 430 is removed via a vacuum tap 460, which creates a pressure differential in system 400 to provide compaction pressure on the part inside the vacuum bag 430. In exemplary embodiments, vacuum bag 430 may be placed inside a pressurized autoclave 470, such that the hyperbaric pressure inside autoclave 470, external to vacuum bag 430, is raised to a predetermined level. The predetermined level may be ambient atmospheric pressure up to 1000 psi to provide compaction force while the pressure under vacuum bag 430 is maintained at a vacuum of 2 to 29 inch Hg.

In an exemplary embodiment, heat is more easily produced in a high-pressure environment and facilitates the transfer of dye to receiving material 450. The temperature inside the autoclave may be set to a predetermined heating rate profile, temperature hold and cool down profile. Typical temperature ramp rates vary from 2-50° F. per minute, to temperatures ranging from 70° F. to 600° F., with cool down rates ranging from 2-20° F. per minute. For the cooling profile, cool the material to a temperature such that the finished article remains flat or in the desired shape and such that there is no damage, distortion or delamination of the finished colorized material. Once the system is at or below the removal temperature, remove the material and color carrier from the autoclave and remove from the bag. In an exemplary embodiment, autoclave color transfer system 400 is very effective and can be incorporated into a Composite Material autoclave or vacuum bag manufacturing process.

Figure 5:
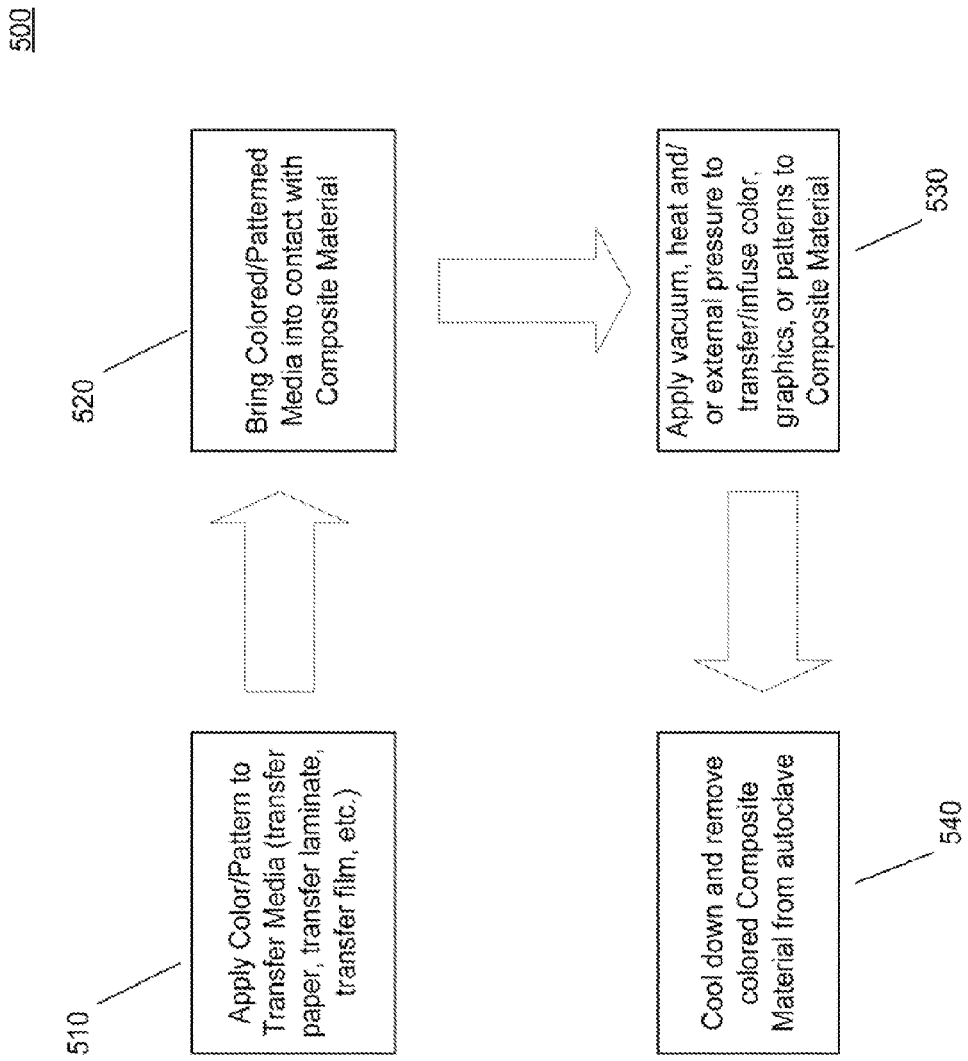
FIG. 5 illustrates a flow chart of an exemplary autoclave process.

In an exemplary process and with reference to FIG. 5, an autoclave process 500 includes four primary steps. First, apply a color tint/dye transfer to the color carrier, which may include laminate with surface films or cloth surface on one or both sides, or transfer paper/film carrier (510). The film or cloth surface may incorporate a complementary color or pre-printed pattern, image or design on either or both sides of the laminate. The transfer paper or media may contain solid color, a single or multi color pattern or printed graphics to form an image, design or picture. The transfer media may also include a smooth or textured surface to impart a surface with given degree of gloss, smoothness texture pattern on one or both sides of the colorized Second, place the color tint/dye transfer in contact with the Composite Material (520). Third, apply heat and pressure, and vacuum to transfer and/or infuse or sublimate the color, graphics, textures, or patterns to the materials (530). Temperatures typically range from about 70° F. to about 650° F., and pressures range from the minimum to keep materials in intimate contact, typically ambient atmospheric pressure to a maximum of 1000 psi. The temperature and pressure applied depend on the particular colorant used, the substrates the colorant is applied to, and the degree of lamination or consolidation required. Fourth, cool the material to a temperature such that the finished article remains flat or in the desired shape, and such that there is no damage, distortion, or delamination of the finished colorized material. Once the system is at or below the removal temperature, remove the material and color carrier from the vacuum bag tool assembly (540). In various appropriate embodiments, the material may be exposed to ultraviolate or electron beam radiation to cure or set curable tints or dyes.

Linear Color Transfer System

Figure 6:
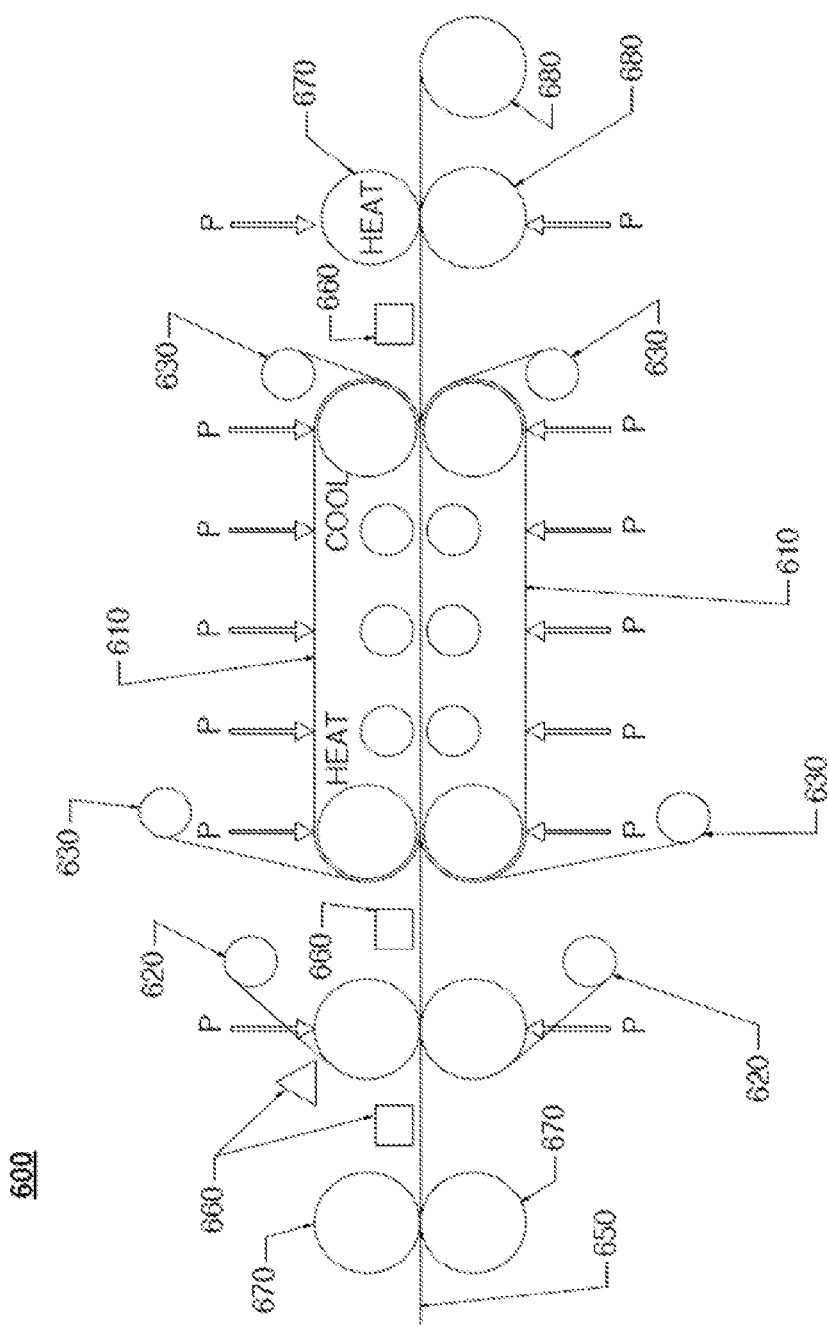
FIG. 6 illustrates an exemplary embodiment of a linear color transfer system.

In one exemplary embodiment and with reference to FIG. 6, a linear color transfer system 600 comprises a rotating horizontal belt press 610, a film or membrane 620, and color transfer carrier 630. The endless rotating belts form a continuous process capable of applying a uniform, continuous consolidation pressure to a Composite Material 650, and color transfer film or paper carrier 630 to maintain intimate contact for infusion or sublimation color transfer. The materials are heated to a sufficient temperature to perform the color infusion in the pressurized heating zone and then cooling the Composite Material and color transfer media to a temperature that is at or below the safe removal temperature for the Composite Material. The linear color transfer system 600 may be a continuous roll-to-roll process for applying color or graphics to Composite Material 650. The Composite Material 650 that receives the color may be fabric, cloth, film, or laminated material. The film or fabric 620 can then be used in the manufacture of Composite Materials. For example, a web of assembled layers of rolls of finished Composite Material, film or fabric 620 precursors may be run through linear color transfer system 600 to set or infuse the colors. In an exemplary embodiment, material 650 may be pre-coated or pre-printed with color before being fed through the belt press portion of linear color transfer system 610 by means of printer, coater or treater 660. The colorized Composite Material may then be run through a set of calendar or embossing rolls 670 to apply a smooth shiny or matt surface to the Composite Material or to apply a texture to one or both outer surfaces. The rolls 670 may be heated, chilled or left at room temperature depending upon the desired surface finish, surface texture, the exit temperature of the Composite Material from the belt portion of the press or the specific materials. Typical running speed for the Composite Material web ranges from 2-250 ft per minute. The nip rolls 670 and belt sections of the press 610 can be set either for a predetermined gap or a for a preset pressure to the preset roll gaps or with the gaps set to zero with a preset pressure to ensure full consolidation with a given pressure distribution. Typical gap settings range from 0.0002" up to 0.125" and typical pressures range from 5 to 1000 lbf per linear inch of width. The rolls and belt system can be heated to consolidate the materials and/or transfer, infuse or sublimate into one or both sides of the Composite Material. Individual plies may be layed up on the web by hand layup, by automated tape layup or by an automated robotic pick and place operation. Furthermore, typical heating temperature set points range from 70° F. to 550° F.

Radiation curing systems such as an E-beam or UV lamp array can be located in-line. One advantage of the linear system is that it can integrate the assembly of unitape plies into a structural reinforcement, the application of the colorant, the incorporation of the various arbitrary internal or surface film layers, non woven cloth layers and woven layers into a multi-step integrated manufacturing process where base unitapes are converted to finished colorized roll goods.

Multilayer Composite Material Color Infusion

Figure 7:
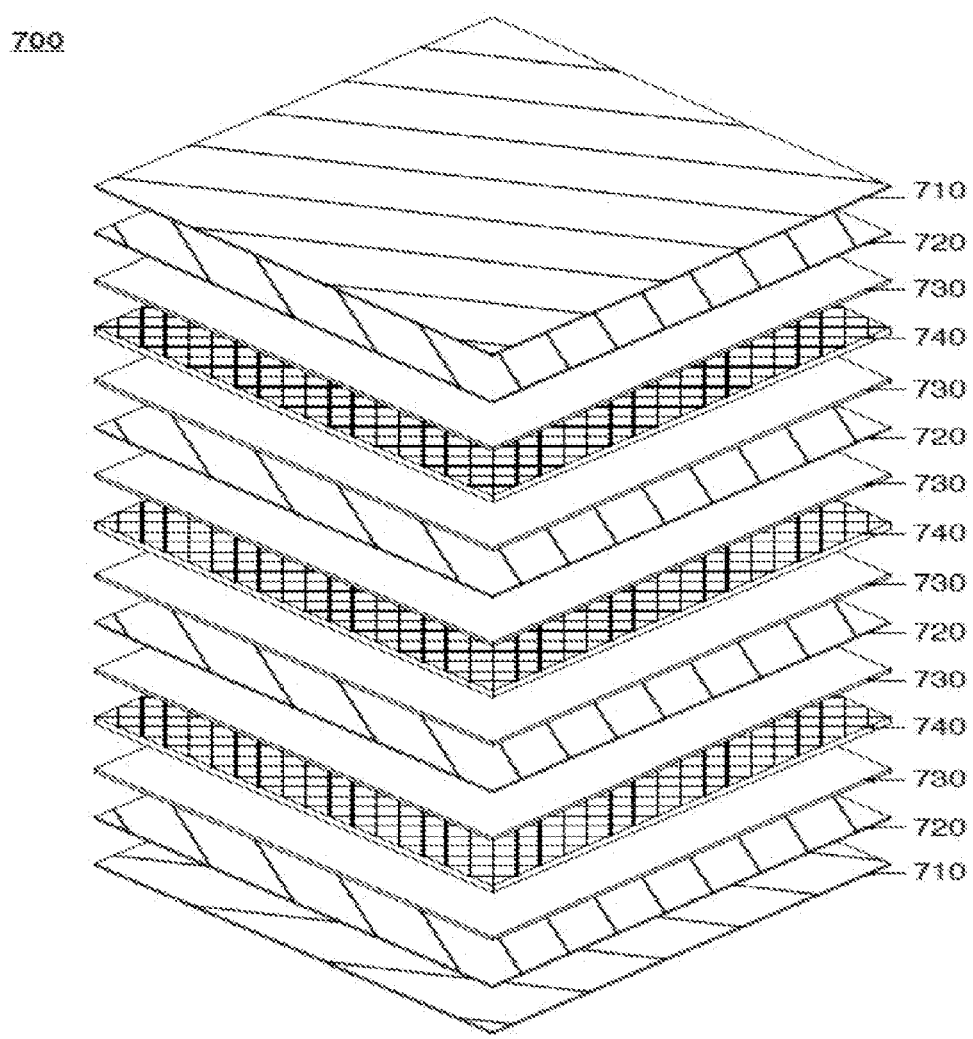
FIG. 7 illustrates an exemplary embodiment of a multilayered color transfer stack.

In an exemplary embodiment, multilayer Composite Material color infusion can be performed using either a heated press color transfer system, such as system 200 or an autoclave color transfer system, such as system 400. In either process and with reference to FIG. 7, a multilayered stack comprising multiple caul plates 710, barrier/breather layers 720, color carriers 730 and laminates 740 may be substituted for the single stack of Composite Material and color carrier described in system 200 and system 400.

Batch Dye Infusion

In an exemplary embodiment, Composite Material, surface films and surface fabrics can also have colors incorporated via batch dying or infusion. In this process, rolls of Composite Material, film or fabrics are saturated with color media or tint and placed in a vessel and exposed to an appropriate heat, pressure or vacuum profile to apply to infuse color media. The films or fabrics treated in this manner may then be incorporated into laminates.

Matrix Pigment and Tint Coloring

In an exemplary embodiment, pigment is added to the adhesive that is incorporated into the unidirectional fiber tape manufacturing process thereby resulting in a color infused unidirectional tape subsequently used in the manufacture of the Composite Material. For example, such color additives include titanium dioxide, carbon black, phthalo blue, quinacridone red, organic yellow, phthalo green, dark yellow orcher, ercolano orange, venetian red, burnt umber, viridian green, ultramarine blue and pewter grey. In an exemplary embodiment the colored Composite Material that results from the use of the colored unitape may be additionally colored using the before-mentioned processes, namely Heated Rotary System 100, Heated Press System 200/300, Autoclave System 400/500, Linear System 600, Multilayer Laminate Color Infusion 700, Batch Dye Infusion.

Additional details with regards to material, process, methods and manufacturing, refer to U.S. Pat. No. 5,470,062, entitled "COMPOSITE MATERIAL FOR FABRICATION OF SAILS AND OTHER ARTICLES," which was issued on Nov. 28, 1995, and U.S. Pat. No. 5,333,568, entitled "MATERIAL FOR THE FABRICATION OF SAILS," which was issued on Aug. 2, 1994, and U.S. patent application Ser. No. 13/168,912, entitled "WATERPROOF BREATHABLE COMPOSITE MATERIALS FOR FABRICATION OF FLEXIBLE MEMBRANES AND OTHER ARTICLES," which was filed Jun. 24, 2011; the contents of which are hereby incorporated by reference for any purpose in their entirety.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

Although applicant has described applicant's preferred embodiments of this invention, it will be understood that the broadest scope of this invention includes modifications such as diverse shapes, sizes, and materials. Such scope is limited only by the below claims as read in connection with the above specification. Further, many other advantages of applicant's invention will be apparent to those skilled in the art from the above descriptions and the below claims.

What is claimed is:

1. A method of transferring a dye to a composite material, the method comprising:
   a) applying the dye to a transfer media to create a colored transfer media;
   b) placing the colored transfer media in proximity to the composite material; and
   c) applying at least one of heat, external pressure, and vacuum pressure to transfer the dye to the composite material to create a colored composite material.

2. The method of claim 1, further comprising cooling the composite material to a temperature such that the composite material maintains a desired shape.

3. The method of claim 1, further comprising curing the dye, by applying at least one ultraviolet or electron beam radiation, to the composite material.

4. The method of claim 1, further comprising adding a polyimide coating to the composite material.

5. The method of claim 1, further comprising adding a polyvinyl fluoride (PVF) film to the composite material.

6. The method of claim 1, further comprising adding a nylon coating and a urethane coating to the composite material.

7. The method of claim 1, wherein composite material is a non-woven material.

8. The method of claim 1, wherein composite material is a woven material.

9. The method of claim 1, wherein composite material comprises at least one layer of woven materials and at least one layer of non-woven materials.

10. The method of claim 1, wherein the transfer media is at least one of transfer paper, transfer laminate, or transfer film.

11. The method of claim 1, wherein the dye may be applied to the transfer media in the shape of a pattern, graphic or logo, and wherein the colored composite material comprises a matching pattern, graphic or logo, respectively.

12. The method of claim 1, wherein the dye is applied to the transfer media using direct printing.

13. The method of claim 1, wherein the at least one of heat, external pressure, and vacuum pressure is applied using at least one of a heated rotary system, a heated press system, an autoclave system, a dye infusion system, a heated linear color transfer system, and a matrix pigment tint coloring system.

14. A method of infusing a dye into a composite material, the method comprising:
   a) applying the dye to a transfer media to create a colored transfer media;
   b) placing the colored transfer media in proximity to the composite material; and
   c) applying at least one of heat, external pressure, and vacuum pressure to sublime the dye and infuse the dye into the composite material to create a colored composite material,
   wherein the composite material comprises one of more layers of unidirectional fiber and polymer matrix plies oriented in one or more directions.

15. The method of claim 14, wherein the at least one of heat, external pressure, and vacuum pressure is applied using at least one of a heated rotary system, a heated press system, an autoclave system, a dye infusion system, a heated linear color transfer system, and a matrix pigment tint coloring system.

16. The method of claim 14, wherein the dye comprises at least one of a sublimating color and sublimating pattern.

17. The method of claim 14, further comprising cooling the composite material to a temperature such that the composite material maintains a desired shape.

18. The method of claim 15, wherein the at least one of heat, external pressure, and vacuum pressure is applied using an autoclave.

* * * * *